United States Patent [19]
Toguchi

[11] Patent Number: 5,859,690
[45] Date of Patent: Jan. 12, 1999

[54] METHOD OF DIVIDING AND EXPOSING PATTERNS

[75] Inventor: Manabu Toguchi, Kawagoe, Japan

[73] Assignee: Nikon Corporation, Tokyo, Japan

[21] Appl. No.: 824,268

[22] Filed: Mar. 26, 1997

[30] Foreign Application Priority Data

Mar. 28, 1996 [JP] Japan .................................... 8-099324
May 4, 1996 [JP] Japan .................................... 8-110305

[51] Int. Cl.⁶ .................................................. G03D 27/42
[52] U.S. Cl. ............................................ 355/53; 257/211
[58] Field of Search ................................ 355/43–45, 53, 355/77; 250/492.2, 398

[56] References Cited

U.S. PATENT DOCUMENTS

| 4,708,466 | 11/1987 | Isohata et al. | 355/53 |
| 4,814,830 | 3/1989 | Isohata et al. | 355/54 |
| 4,878,086 | 10/1989 | Isohata et al. | 355/77 |
| 5,539,224 | 7/1996 | Ema | 257/211 |

*Primary Examiner*—D. Rutledge
*Attorney, Agent, or Firm*—Michael N. Meller

[57] ABSTRACT

A method of dividing a circuit pattern to be transferred by a photoprinting apparatus from a reticle to a photosensitive surface. The circuit pattern has a display section and a conductor section. The method includes dividing the circuit pattern into a plurality of divided patterns wherein each of the divided patterns includes at least a part of the display section and a part of the conductor section; and forming a plurality of reticles, each of the reticles having at least one of the divided patterns thereon.

15 Claims, 9 Drawing Sheets

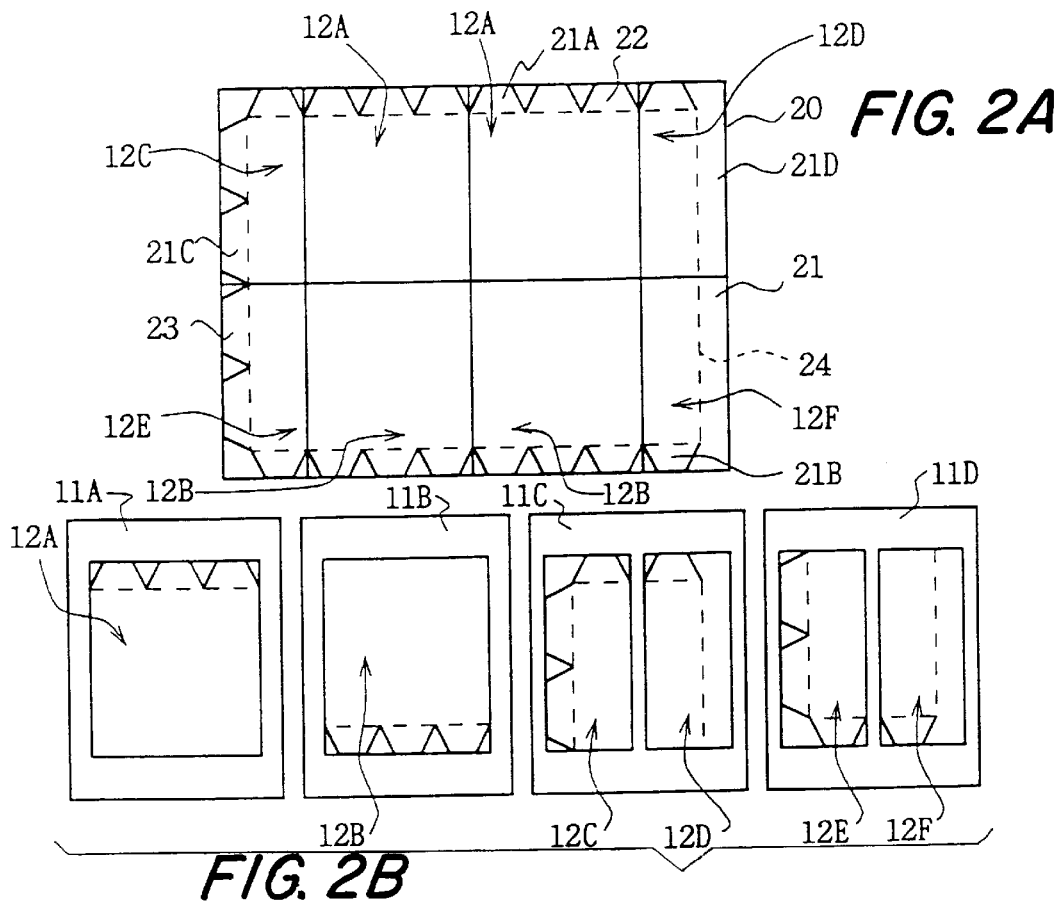
FIG. 2A
FIG. 2B
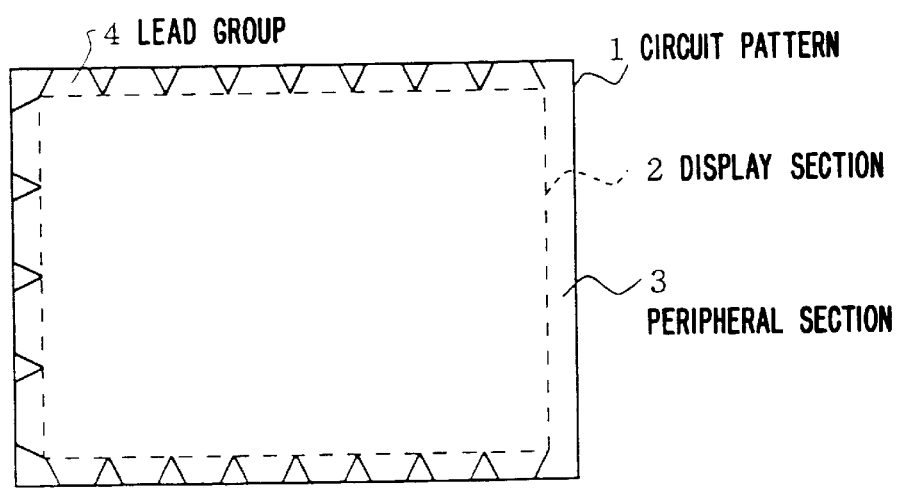
FIG. 12

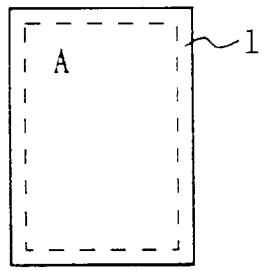
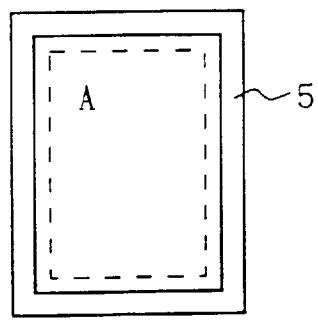
FIG. 13A PRIOR ART　　FIG. 13B PRIOR ART
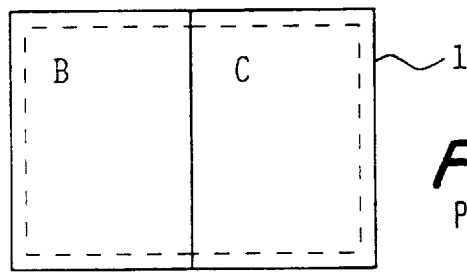
FIG. 14A PRIOR ART
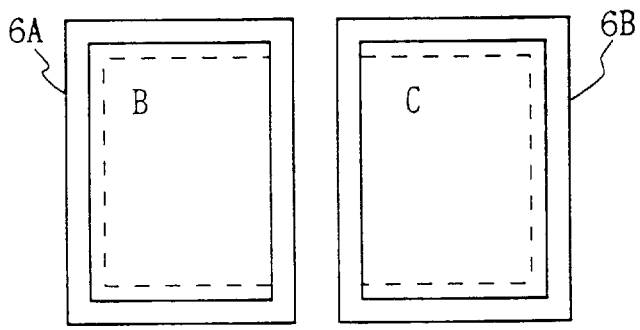
FIG. 14B PRIOR ART

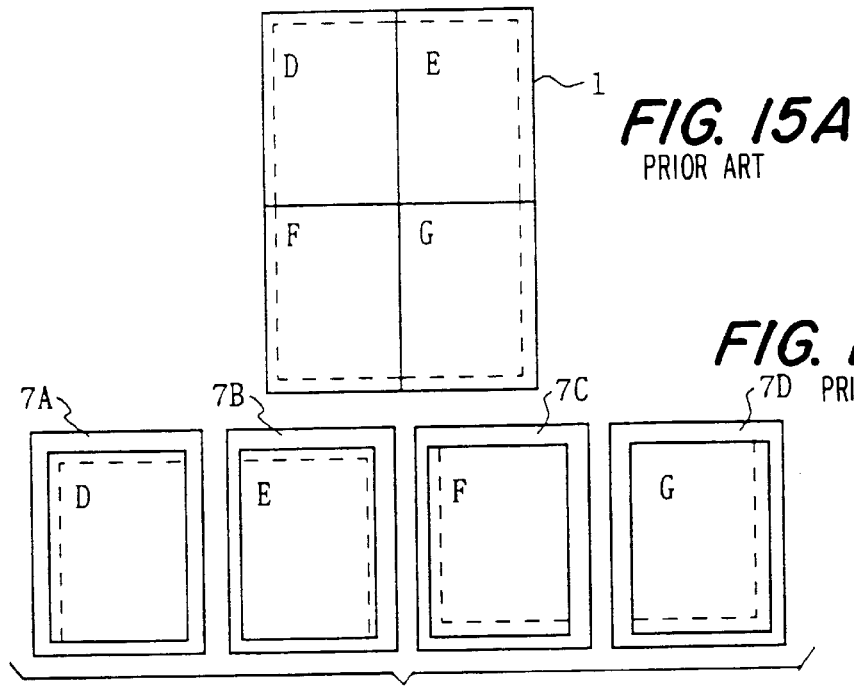
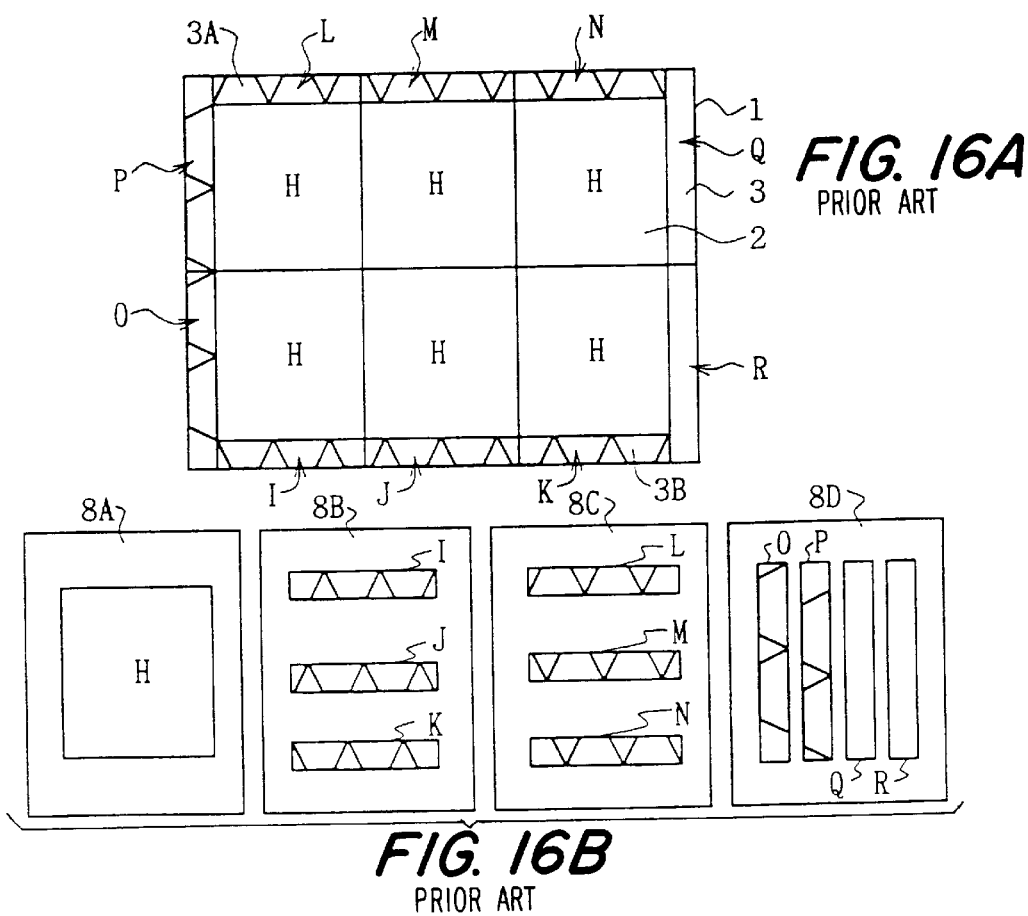

METHOD OF DIVIDING AND EXPOSING PATTERNS

BACKGROUND OF THE INVENTION

The present invention relates to a method of dividing and exposing patterns. More particularly, the present invention relates to a method of dividing and exposing circuit patterns forming a liquid crystal display (LCD) with a plurality of divided patterns.

In recent years, liquid crystal displays have been used as display elements for personal computers, TV receivers, etc. in large quantities. Conventionally, the liquid crystal displays have been manufactured using glass substrates with photolithographically transferred circuit patterns.

A projection exposure apparatus is commonly used in an exposure process in which the images of circuit patterns are photolithographically transferred onto glass substrates. The exposure apparatus emits light from a light source for photolithographic transfer of the image through a reticle having liquid crystal display circuit patterns. Then it superimposingly projects the images of the circuit patterns by means of light going through the reticle onto a glass substrate via a projector lens system.

In this case, as illustrated in FIG. 12, a circuit pattern 1 of a liquid crystal display is formed in a rectangular shape consisting of a display section 2 and a peripheral portion 3 surrounding the display section 2. The display section 2 is a pattern in which a plurality of electrodes corresponding to a plurality of pixels of red, green, and blue are arranged regularly. The peripheral portion 3 comprises a plurality of, for example, trapezoidal interconnecting portions 4 (hereafter referred to as the "lead group") for connecting each of the electrode patterns with a plurality of drive circuits, not illustrated.

Recently, larger size liquid crystal displays have been in greater demand. The demand is met with the following step-and-repeat technique. When the size of a circuit pattern 1 of a liquid crystal display is larger than that of the effective diameter of the projection lens of the aforementioned exposure apparatus and larger than the area on which a reticle circuit pattern is formed (hereafter these sizes are referred to as "effective fields"), the circuit pattern 1 is divided into a plurality of types of patterns corresponding to the effective fields. In this case, a plurality of circuit patterns are formed by dividing a pattern (hereafter referred to as the "divided patterns") on a plurality of reticles. The images of the patterns of the reticles are then superimposingly photoprinted onto predetermined positions on each of the glass substrates in the exposure apparatus to transfer the circuit pattern 1 from the reticle onto the aforementioned glass substrate.

Now, as illustrated in FIGS. 13(A) and 13(B), when a liquid crystal display circuit pattern 1 is almost as large as the effective field, the aforementioned circuit pattern 1 is not divided [FIG. 13(A)], and the circuit pattern 1 is formed on a reticle 5 [FIG. 13(B)]. The resist film on a glass substrate is superimposingly photoprinted relative to the circuit pattern 1 through the reticle 5 by "one exposure" processing in the exposure apparatus.

As illustrated in FIGS. 14(A) and 14(B), when the size of the circuit pattern 1 of the liquid crystal display is larger than the aforementioned effective field and up to about twice as large as the effective field, the aforementioned circuit pattern 1 is divided into divided patterns B and C [Figure 14(A)] corresponding to the effective field to be transferred onto reticles 6A and 6B [FIG. 14(B)].

In this case, the exposure apparatus, for example, first photoprints the image of the left-half B of the divided circuit pattern 1 onto the resist film on the glass substrate through the reticle 6A; then, photoprints the image of the remaining right-half C of the divided circuit pattern 1 onto the resist film on the glass substrate through the reticle 6B. As such, in an exposure apparatus, the circuit pattern 1 is photolithographically transferred onto a resist film on a glass substrate using reticles 6A and 6B and two exposures.

As illustrated in FIGS. 15(A) and 15(B), when the circuit pattern 1 of a liquid crystal display is larger than the effective field by twice or more and less than about four times, the aforementioned circuit 1 is divided into four divided patterns D, E, F, and G [Figure 15(A)] corresponding to the effective field. These divided patterns D through G are printed on reticles 7A, 7B, 7C, and 7D, respectively [Figure 15(B)].

The exposure apparatus first superimposingly photoprints the image of the upper left divided pattern D of the circuit pattern 1 onto a resist film on a glass substrate through a reticle 7A. Then the image of the upper right divided pattern E of the circuit pattern 1 is transferred onto the resist film on a glass substrate through a reticle 7B. After that it photoprints the image of the lower left divided pattern F of the circuit pattern 1 onto the resist film on the glass substrate through a reticle 7C. Finally, it photoprints the image of the lower right divided pattern G of a circuit pattern 1 onto a resist film on the glass substrate through a reticle 7D. As such, the exposure apparatus photolithographically transfers the circuit pattern 1 onto the resist film on the glass substrate using the reticles 7A, 7B, 7C, and 7D and four exposures.

Examples of this technique are described in U.S. Pat. Nos. 4,708,466 and 4,814,830.

Recently, however, a technique to increase manufacturing efficiency of a liquid crystal display has been introduced, namely the so-called "plural-area method." With this method, a plurality of liquid crystal display circuit patterns are photolithographically transferred onto an integral substrate to obtain a plurality of liquid crystal displays a so-called "plural-area production".

To apply the aforementioned step-and-repeat exposure in the plural-area production method, the lithographic pattern transfer can be performed by the number of exposures which is equal to the number of areas produced using each of the reticles having divided circuit patterns obtained by dividing a circuit pattern for the manufacture of a liquid crystal display.

When the size of such a liquid crystal display circuit pattern 1 is four times larger than that of the effective field, the aforementioned circuit pattern 1 is divided into a display section 2 and a periphery section 3 corresponding to the effective field, and the display section 2 and the periphery section 3 are divided further into smaller areas.

For example, as illustrated in FIG. 16(A), the display section 2 is divided into six even areas on the liquid crystal display circuit pattern 1.

In this case, because each of the electrode patterns in the display section 2 are relatively small and regularly arranged corresponding to each of the pixels, the display section 2 is divided into six almost identical divided patterns H.

Regarding the periphery section 3, each of the edges (hereafter referred to as "the first and the second edges") 3A and 3B arranged along the direction of the longer side of the circuit pattern 1 (hereafter simply referred to as "a longer side") are almost evenly divided into three sections. Also, each of the edges (hereafter referred to as "the third and the fourth edges") arranged in the direction perpendicular to the longer side are divided almost evenly into two sections.

In this case, in the periphery section 3, each of the lead patterns of the lead group 4 is relatively larger than each of the electrode patterns of the display section 2, and it is difficult to divide the periphery section 3 at the border of each of the adjacent lead groups 4, thus splitting the lead group 4 into two. Therefore, in the periphery section 3, the number of patterns increases because each of the divided patterns I, J, K, L, M, N, O, P, Q and R takes a different pattern.

For this reason, as illustrated in FIG. 16(B), when forming each of these divided patterns H through R onto a reticle 8, the conventional technique effectively uses the area of the surface on which divided circuit patterns H through R of the reticle 8 are formed. The divided pattern H is formed on a reticle 8A and each of the divided patterns, respectively, form a plurality of groups, I to K, L to N, and O to R to be, respectively, formed on each of the reticles 8B, 8C, and 8D. The technique decreases the number of reticles 8A through 8D required to accommodate the divided patterns H to R of a plurality of types.

Now, when superimposingly photoprinting using these reticles 8A, 8B, 8C, and 8D, the image of the display section 2 of the circuit pattern 1 is superimposingly photoprinted onto a glass substrate six times sequentially, first for example using the reticle 8A. Then using the reticles 8B, 8C, and 8D, the image of the periphery section 3 of the circuit pattern 1 is superimposingly photoprinted onto the glass substrate ten times sequentially while shutting off patterns other than the divided patterns required for exposure processing using a shutter plate.

Compared to a liquid crystal display having a circuit pattern size which is smaller than four times the size of the effective field, the liquid crystal display whose size of the circuit pattern 1 is larger by four times or more than the size of the effective field encounters a problem in that the number and the type of divided patterns I through R increase sharply. Also, the number and the types of exposure processing performed in an exposure apparatus increases sharply as well (sixteen times in the aforementioned case.) It also encounters a problem in that the throughput, the ability to process substrates per unit of time during exposure processing, decreases sharply.

Therefore, when a liquid crystal display circuit pattern 1 is four times or more larger than the effective field, the design of the reticle 8 has to take the number of divisions of the circuit into account, thus making difficult the designing of the aforementioned reticle 8.

In addition, the attempt to obtain plural divided areas of a liquid crystal display circuit pattern whose size is larger by four times or more than the effective fields of a projection lens system and reticles encounters problems of increasing the number of exposures and decreasing the throughput.

Plural divisions are produced basically to increase manufacturing efficiency of substrates. However, the attempt to print plural divided areas on an integrated substrate unfavorably increases the number of exposures, as mentioned, and decreases throughput. This is harmful in terms of efficiency.

SUMMARY OF THE INVENTION

Accordingly, it is an object of the present invention to overcome the problems noted above with respect to prior art solutions.

Another object of the present invention is to resolve the above problems by providing a method of dividing a circuit pattern which reduces the number of exposures required for transferring a circuit pattern to a photosensitive substrate.

A further object of the present invention is to provide an exposure method and a reticle which reduces the number of exposures required for transferring a circuit pattern onto a photosensitive substrate and to increase throughput.

To resolve the problems of conventional technology, the present invention provides a method of dividing a circuit pattern used for printing a circuit pattern onto a reticle wherein the circuit pattern comprises a display section having a plurality of electrodes corresponding to a plurality of pixels and a conductor section formed to conduct each of the electrodes surrounding the display section such that at least one divided region includes a part of the display section and a part of the conductor section.

Also, the exposure apparatus having a projection lens system photoprints the circuit patterns onto a photosensitive substrate and the circuit pattern is divided based on at least one of three factors, the size of the circuit pattern, the number of conductor sections, and the real diameter of the projection lens system.

Therefore, the present invention greatly decreases the number of divisions of a circuit pattern.

Moreover, in the photolithographic technique in which divided patterns on reticles are superimposingly photoprinted onto a photosensitive substrate printed with divided circuit patterns obtained by dividing a circuit pattern used for photoprinting of more than two images of the circuit pattern, a first divided pattern of the circuit pattern and a second divided pattern of the circuit pattern which would be adjacent each other on the photosensitive substrate are formed on the reticle; photolithography is performed at the same time for the first and the second divided patterns on the reticle.

Furthermore, on reticles used for photolithographic printing of more than two images of the circuit pattern, via a projection lens system, obtained by dividing a circuit pattern, a first and a second divided pattern of the circuit pattern which would be next to each other are formed as a photolithographic pattern.

These techniques of the present invention can greatly decrease the number of exposures during photoprinting of the circuit pattern onto a photosensitive substrate or surface.

BRIEF DESCRIPTION OF THE DRAWINGS

The above and other objects, features, and advantages of the present invention will become more apparent from the following detailed description taken with the accompanying drawings, in which:

FIGS. 2(A) and 2(B), are a schematic diagram showing a first embodiment of a dividing mechanism of the circuit pattern of a liquid crystal display in accordance with the principles of the present invention;

including

FIG. 12 are a schematic diagram showing a configuration of a liquid crystal display circuit pattern;

FIGS. 13(A) and 13(B), are a schematic diagram of the prior art showing a liquid crystal display circuit pattern whose size is smaller than the effective field;

FIGS. 14(A) and 14(B), are a schematic diagram showing a prior art method of dividing a liquid crystal display circuit pattern whose size is larger than that of the effective field by up to about twice;

FIGS. 15(A) and 15(B), are a schematic diagram showing a prior art method of dividing a liquid crystal display circuit pattern whose size is larger than that of the effective field by twice or more up to about four times; and FIGS. 16(A) and 16(B), are a schematic diagram showing a method of dividing a liquid crystal display circuit of a conventional technology whose size is larger than four times that of the effective field.

DETAILED DESCRIPTION OF THE PREFERRED EMBODIMENT

Figure 1:
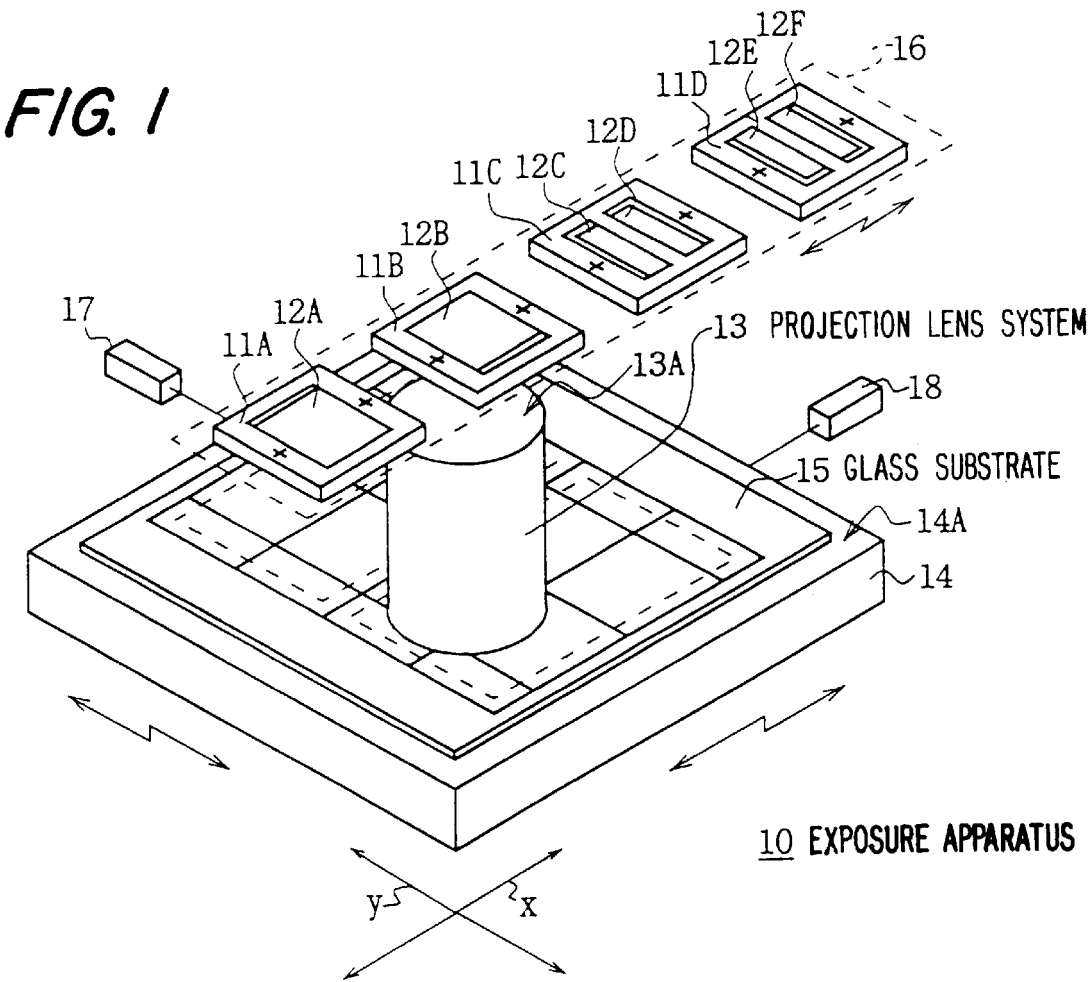
FIG. 1 is a perspective view of a first embodiment of an exposure apparatus incorporating the principles of the present invention.

Referring to the drawings, the first embodiment of the present invention is described.

In FIG. 1, 10 shows an exposure apparatus of the first embodiment as a whole. This exposure apparatus 10 is controlled by a controller, not illustrated, to photoprint a liquid crystal display circuit pattern comprising for example a display section and a peripheral section.

Reticles 11A, 11B, 11C, and 11D having a divided pattern of a liquid crystal display circuit pattern are sequentially irradiated with light from a light source via an illumination system, not illustrated. Note that the illumination system is arranged with a shutter for defining the illuminated region for each of the reticles.

Each of the reticles 11A, 11B, 11C, and 11D, respectively, have divided patterns 12A, 12B, 12C, 12D, 12E, and 12F which are formed with alignment marks arranged around the outer periphery.

The transmitted images of the divided patterns are photoprinted at predetermined positions on a square photosensitive glass substrate 15 loaded on an XY stage 14 via a projection lens system 13.

In the present embodiment, the size of the liquid crystal display circuit pattern is larger than the projection lens system 13 and the effective field by four times or more and each of the reticles 11A, 11B, 11C, and 11D are divided into six types such that a single divided pattern includes a part of a display section and a part of a peripheral section.

Regarding each of the reticles 11A, 11B, 11C, and 11D, are relatively large divided pattern is printed on reticles 11A and 11B such that the area in which each of the divided patterns 12A and 12B are printed can be used effectively. Two relatively small divided patterns 12C, 12D, 12E, and 12F are, respectively, printed on reticles 11C and 11D.

A consecutive exchanger (hereafter referred to as a "reticle exchanger") 16 for exchanging reticles one after another holds each of the reticles 11A, 11B, 11C, and 11D, and is able to move along the X and Y axes in the two-dimensional plane of FIG. 1. The reticle exchanger 16, respectively, aligns one of the reticles 11A, 11B, 11C, and 11D at a predetermined position above the projection lens system 13 via a controller which is not illustrated.

The XY stage 14 vacuum chucks the glass substrate 15 and moves on the two-dimensional plane in the directions of axes X (arrow X) and Y (arrow Y). Also, first and second position detectors 17 and 18, each comprising a laser interferometer and the like for detecting the moving distance in the direction of X and Y axes of the XY stage 14, are arranged at predetermined positions around the XY stage. The controller, which is not illustrated, receives the output signals from the detectors. Then, the controller drives a drive motor, which is also not illustrated, to move the XY stage 14 while detecting the moving distance in the directions of the X and Y axes of the XY stage 14 to position the glass substrate 15 in response to the exposure region of each of the reticles 11A, 11B, 11C, and 11D.

The exposure apparatus 10 first moves the reticle exchanger 16 to position, for example, the reticle 11A at a predetermined position above the projection lens system 13, and at the same time, moves the XY stage 14 to align it on an exposure region corresponding to the reticle 11A. At this stage, the illumination system, which is not illustrated but is arranged above the projection lens system 13, irradiates the reticle 11A with exposure light and the image of the divided pattern 12A of the reticle 1 1A is transferred onto the glass substrate 15 via the projection lens system 13. Also, the exposure system 10 superimposingly transfers by photo-printing the image of divided patterns of reticles 11B, 11C, and 11D onto predetermined transfer or "shot" regions on the glass substrate 15 in the same manner as described for the reticle 11A to photoprint the liquid crystal circuit pattern.

Note that when there are two exposure regions corresponding for example to the divided pattern 12A of the reticle 11A on the glass substrate 15, the exposure apparatus 10 photoprints the second time by moving only the glass substrate 15 while maintaining the fixed state of the reticle 11A upon completion of the first photoprinting.

In addition, when photoprinting divided pattern 12C using the reticle 11C having two divided patterns 12C and 12D (or divided patterns 12E and 12 F) as in the reticle 11C (or the reticle 11D), the exposure apparatus 10 shuts exposure light onto the section corresponding to the divided pattern 12D using the aforementioned shutter and irradiates only the divided pattern 12C with exposure light. The controller moves the reticle exchanger 16 prior to the irradiation of exposure light to align the divided pattern 12C of the reticle 11C, and at the same time, moves the XY stage 14 to align the glass substrate 15 with the exposure region corresponding to the divided pattern 12C.

In this way, the image of the divided pattern 12C is photoprinted onto the transfer region corresponding to the divided pattern 12C on a glass substrate 15 via the projection lens system 13.

Now, a method of dividing a circuit pattern when the size of the liquid crystal display circuit pattern is larger than the effective field of the projection lens system 13 and reticles by four times or more is described herein.

First, the size of the display section is determined based on the number of red, green, and blue picture display elements (pixels) and the size of these red, green, and blue pixels. Note that each of the pixels formed on the display section is relatively small in size and is arranged regularly; this allows freedom in dividing the display section.

The number of lead groups is determined for the peripheral section based on the number of red, green, and blue pixels in the display section.

For the peripheral section, based on the number of red, green, and blue pixels in the direction of the longer side of the rectangular display section and the set unit (e.g., 192 or 240) for the lead corresponding to each of the pixels, the number of the lead groups formed at the first and the second edges is shown in the following equation (1):

$$\text{The number of lead groups at the first and the second edges of the peripheral section} = \qquad (1)$$

$$0.5 \times (\text{number of red, green, and blue pixels arranged in the direction of the longer side})/192(\text{or } 240)$$

For this peripheral section (3 in FIG. 12) based on the number of red, green, and blue pixels arranged in the direction perpendicular to the longer side of a rectangular display section and the set unit for the lead corresponding to each of the pixels, the number of the lead groups formed at the third and the fourth edges is show in the following equation (2):

$$\text{The number of lead groups at the third and the fourth edges of the peripheral section} = \qquad (2)$$

$$0.5 \times (\text{No. of pixels arranged in the direction perpendicular to the longer side})/192(\text{or } 240).$$

Each of the lead groups for each of the first, the second, and the third edges of the peripheral section are almost the same patterns. Therefore, when dividing the first edge of the peripheral section, for example, it is divided on the border between adjacent lead groups. In this case, a reticle is printed with one lead group pattern; the exposure apparatus 10 steps and repeats using the reticle 11 to transfer the image of the reticle 11 at the first edge of the peripheral section on the glass substrate 15 as many times as the number of lead groups formed at the first edge of the peripheral section on the glass substrate 15.

When a relatively large number of lead groups are formed at the first edge of the peripheral section, the number of exposures corresponding to the first edge of the peripheral section increases relative to the number of lead groups in the exposure apparatus 10. That is, when there are eight lead groups formed on the first edge of the peripheral section, there will be eight exposures repeated onto the first edge only. Knowing this, when dividing the first edge of the peripheral section, it is better that, for example, two to three lead groups form one divided pattern corresponding to the effective field using the border between adjacent lead groups. This can reduce the number of divisions when dividing the first edge of the peripheral section. In this way, forming a divided pattern made of two to three lead groups at the first edge on the reticle 11, and photoprinting the circuit pattern in the exposure apparatus 10 decreases the number of exposures.

In addition to the aforementioned method of dividing the peripheral section, there is another technique for dividing a liquid crystal display circuit pattern in which one divided pattern includes a part of a display section and a part of a peripheral section (e.g., a peripheral section having two to three lead groups), not dividing the peripheral section and the display section. This decreases the number of divisions for a liquid crystal display circuit pattern.

A liquid crystal display circuit pattern having a size larger than the effective field by four times or more is described specifically referring to a circuit pattern in which 1024 of each of the red, green, and blue pixels are arranged along the direction of the longer side of the rectangular display section and 768 pixels are arranged along the direction perpendicular to the longer side of the rectangle.

As shown in FIG. 2(A), a circuit pattern 20 comprises eight lead groups 22 [the aforementioned equation (1)] at each of the first and the second edges 21A and 21B of the peripheral section 21 and four lead groups 23 [the aforementioned equation (2)] at the third edge 21C of the peripheral section 21. Note that the set unit for leads is 192.

In this case, the liquid crystal display circuit pattern 20 is divided based on the size of the circuit pattern 20, the number of lead groups 22 and 23 on the first (or the second) and the third edges 21A (or 21B) and 21C, and the effective field. First, the circuit pattern 20 is divided in two along the direction perpendicular to the longer side of the rectangle such that one pattern is formed with four lead groups 22 at each of the first edge 21A and the second edge 21B of the peripheral section 21. Then, each of the blocks obtained by dividing the circuit pattern 20 is divided in two at the center side of the circuit pattern 20 such that one pattern is formed with three lead groups 22 at the first edge 21A and the second edge 21B. In this way, the circuit pattern 20 is divided in four along the direction perpendicular to the longer side of the rectangle.

Next, the circuit pattern 20 is divided along the direction of the longer side of the rectangle such that one pattern is formed with the two lead groups 23 at the third edge 21C. In this way, the circuit pattern 20 is divided into eight divided patterns 12A through 12F.

In the aforementioned method of dividing, the length of the display sections 24 is equivalent to the total length of three or less of the lead groups 22 along the direction of the longer side of the rectangle, and is equivalent to the total length of the two lead groups 23 along the direction perpendicular to the longer side of the rectangle to form one divided pattern with the display section 24 and the peripheral section 21 divided along the direction of the longer side of the rectangle or in the direction perpendicular to the longer side of the rectangle. The number of divisions obtained for this embodiment is half of that obtained for the circuit pattern 1 (FIG. 16) conventionally divided into 16 divided patterns H through R.

Note that two divided patterns 12A on the side of the first edge 21A divided at the center of the circuit pattern 20 in this way is almost the same as the lead groups 22 in number 1 (FIG. 16) in the direction in which the divided patterns 12A and the lead groups 22 contact each other. The size is the same as the display section 24, forming the almost identical pattern as a whole. The two divided patterns 12B on the side of the second edge 21B also forms the same pattern for the same reason mentioned above for the divided patterns 12A.

Therefore, as shown in FIG. 2(B), when a reticle is printed with each of the divided patterns 12A through 12F as mentioned above, reticles 11A and 11B are printed with each of the divided patterns 12A and 12B, and at the same time, reticles 11C and 11D are printed with the divided patterns 12C and 12D, and 12E and 12F. Each of the reticles 11A through 11D effectively uses the area in which the divided patterns 12A through 12F are printed.

As described, by dividing the liquid crystal display circuit pattern 20, based on its size, the number of the lead groups 22 and 23 at each of the first (or the second) and the third edges 21A (or 21B) and 21C, and the effective field, such that the length of the display section 24 is equivalent to the total length of three or less of the lead groups 22 arranged along the direction of the longer side of the rectangle, and at the same time, the length is equivalent to the total length of the two lead groups 23 in the direction perpendicular to the longer side of the rectangle to form one pattern with the display section 24 and its adjacent peripheral section 21. This greatly reduces the number of divided patterns for the circuit pattern 20.

In this technique, when the size of the liquid crystal display circuit pattern 20 is larger than the effective field by four times or more, using the reticles 11A through 11D printed with the divided patterns 12A through 12F obtained by dividing the circuit pattern 20 as mentioned, greatly decreases the number of exposures onto the circuit pattern 20 to eight while the conventional circuit pattern 1 (FIG. 16) whose size is larger than the effective field by four times or more uses sixteen exposures. As a result, this technique incorporating the principles of the present invention greatly increases throughput during photolithographic processing.

According to the present invention, the liquid crystal display circuit pattern 20 is divided based on its size, the number of the lead groups 22 and 23 of each of the first (or the second) and the third edges 21A (or 21B) and 21C, and the effective field, such that one of the divided patterns 12A through 12F includes a part of the display section 24 and a part of the peripheral section 21. This greatly decreases the number of divisions of a liquid crystal display circuit pattern 20. As a result, it provides a method of dividing a circuit pattern which is able to greatly reduce the difficulty in designing.

Note that in the above-described embodiment the liquid crystal display circuit pattern 20 is divided based on its size, the number of the lead groups 22 and 23 of each of the first (or the second) and the third edges 21A (or 21B) and 21C, and the effective field. This division is carried out such that the length of the display section 24 is equivalent to the total length of less than three lead groups 22 arranged along the direction of the longer side of the rectangle, and at the same time, is equivalent to the two lead groups 23 in the direction perpendicular to the longer side of the rectangle to form one pattern with the display section 24 and the peripheral section 21 contacting the display section 24. However, the present invention is not limited to this specific application, namely dividing the liquid crystal display circuit pattern 20 based on its size, the number of the lead groups 22 and 23 of each of the first (or the second) and the third edges 21A (or 21B) and 21C, and the effective field. There is no problem in dividing the circuit pattern 20 such that the length of the display section 24 is equivalent to at least one lead group 22 along the direction of the longer side of the rectangle and along the direction perpendicular to the longer side of the rectangle, and the display section 24 and the peripheral section 21 contacting the same is divided as a single divided pattern.

A second embodiment of a method of exposure for photoprinting a plurality of circuit patterns onto a glass substrate 15 in accordance with the principles of the present invention will be described referring to FIGS. 3 through 11. Note that the same components used in the previous embodiment have the same numerals and their detailed descriptions are omitted.

First, a method of dividing a circuit pattern when the size of the liquid crystal display pattern is larger than the effective field of the projection lens system and reticles by four times or more is described. FIGS. 3 and 4 show the method of dividing under the above condition in which divided patterns remain within the effective field.

Figure 3A:
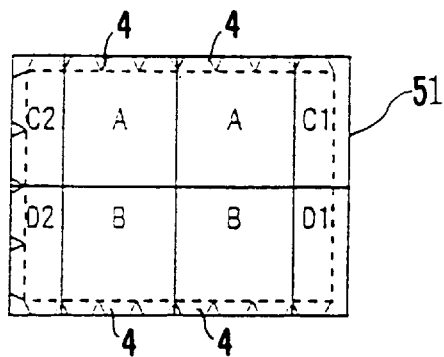
FIG. 3 are a schematic diagram showing an example of dividing a liquid crystal display circuit pattern into more than four divisions.

For example, as shown in FIG. 3(A), the portion of the circuit pattern 51 excluding both edges is divided into four and the excluded edges are divided into two, producing a total of eight divided circuit patterns. Note that, in this case, the circuit pattern 51 is divided at the border of the lead groups 4 such that the two divided circuit patterns in the upper center are the same and so are the two in the lower section. This provides a total of six types of divided circuit patterns, A, B, C1, C2, D1, and D2.

Figure 3B:
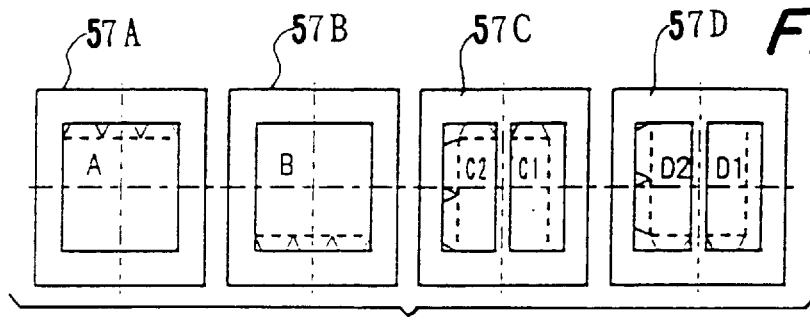

Each of the divided patterns A through D2 are printed onto different reticles 57A through 57D as shown in FIG. 3(B). Note that to effectively use the reticle area, the divided circuit patterns C1 and C2 are printed together onto a reticle 57C and the divided circuit patterns D1 and D2 are formed together onto a reticle 57D.

When photoprinting using the reticles 57A through 57D obtained in this way, the entire liquid crystal display circuit pattern 51 is photoprinted or transferred, for example, as follows: two divided circuit patterns on the upper center of the liquid crystal display are sequentially photoprinted first using the reticle 57A; then the two divided circuit patterns at the lower center are sequentially photoprinted using the reticle 57B; the two divided circuit patterns at the upper edges are photoprinted using the reticle 57C; finally the two divided circuit patterns at the lower edges are photoprinted using the reticle 57D. Note that when photoprinting the divided patterns C1 and C2, and D1 and D2, the divided patterns which are not exposed need to be covered by the aforementioned shutter such that exposure light is not irradiated onto that portion. For example, when photoprinting the divided circuit pattern C2, the portion of the divided circuit pattern C1 is covered by the aforementioned shutter such that the divided pattern A on which the divided circuit pattern C1 has already been photoprinted is not exposed.

Figure 4A:
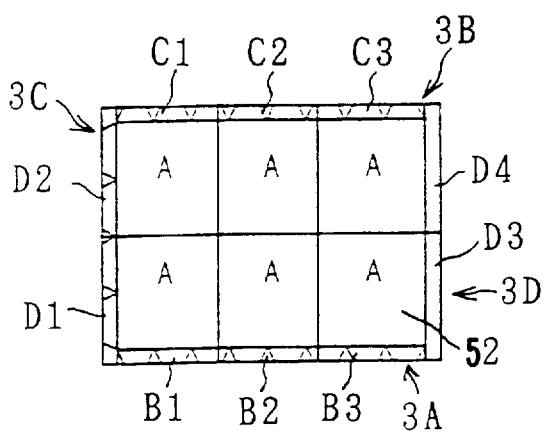
FIGS. 4(A) and 4(B), are a schematic diagram showing an example of dividing a liquid crystal display circuit pattern into more than four divisions.

On the other hand, in FIG. 4(A), evenly dividing a circuit pattern of the liquid crystal display section 52 into six, and dividing each of the circuit patterns at the lower edge 3A and at the upper edge 3B on the peripheral section 3 into three, then dividing the left edge 3C and the right edge 3D of the peripheral section 3 into two, provide a total of sixteen divided circuit patterns. In this case, evenly dividing the display section 52 using the symmetry of the circuit patterns provides the same patterns to any six blocks in the display section 2. Therefore, there are eleven types in divided circuit patterns, A, B1 through B3, C1 through C3, and D1 through D4.

Figure 4B:
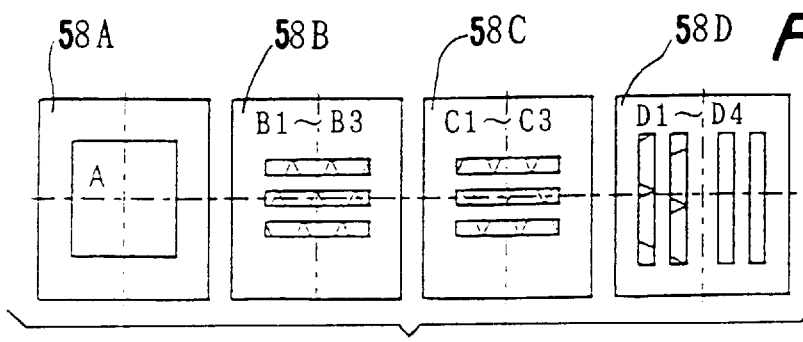

The divided circuit patterns obtained by the above method as shown in FIG. 4(B) are printed onto the reticles 58A through 58D to use the reticle area effectively. In other words, the divided circuit pattern A is printed onto the reticle 58A; the divided circuit patterns B1 through B3 together are printed onto the reticle 58B; the divided circuit patterns C1 through C3 together are printed onto the reticle 58C; and the divided circuit patterns D1 through D4 together are printed onto the reticle 58D.

When photoprinting using these reticles 58A through 58D, first, for example, sequentially photoprint the display section 52 of the liquid crystal display using the reticle 58A; then sequentially photoprint the lower edge 3A of the peripheral section 3 using the reticle 58B; and sequentially photoprint the upper edge 3B of the peripheral section 3; finally sequentially photoprint the left edge 3C and the right edge 3D, thus photoprinting the entire liquid crystal display circuit pattern 52. Note that as in the case described above, when photoprinting the divided circuit patterns B1 through B3, C1 through C3, and D1 through D4, the sections of the divided circuit patterns which are not photoprinted need to be covered by a shutter such that the portion will not be exposed.

In contrast to the method of dividing a circuit pattern as described above, the following method is generally followed for using the plural-area method by forming a plurality of circuit patterns on an integrated single glass substrate 15.

Figure 5A:
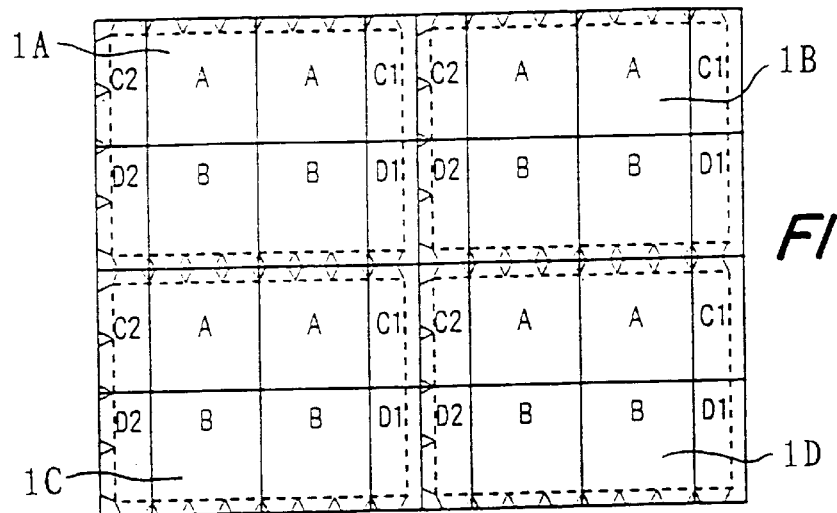
FIGS. 5(A) and 5(B), are a schematic diagram showing an example of dividing a liquid crystal display circuit pattern into more than four divisions and obtaining four areas from an integrated circuit pattern.
Figure 5B:
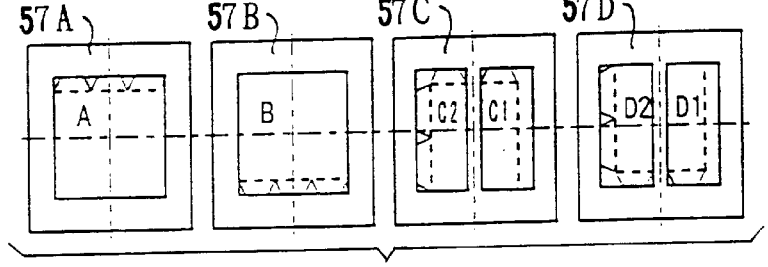
Figure 6A:
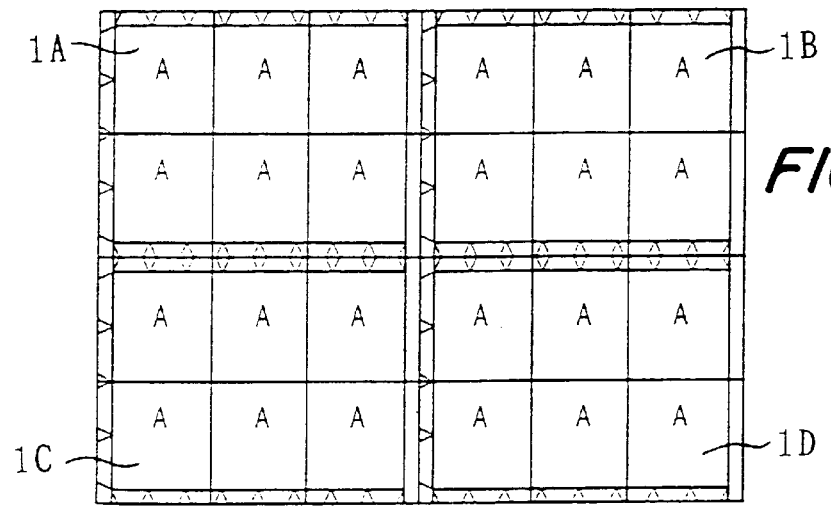
FIGS. 6(A) and 6(B), are a schematic diagram showing another example of dividing a liquid crystal display circuit pattern into more than four divisions and obtaining four areas from an integrated circuit pattern.
Figure 6B:
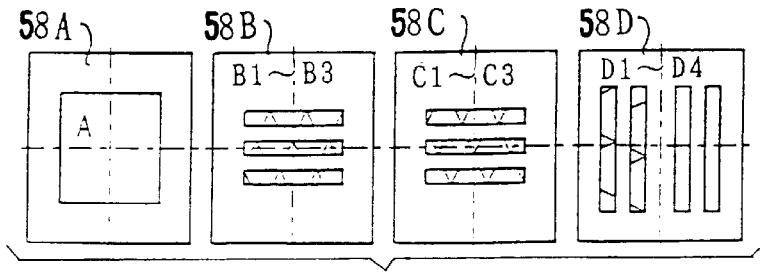

For example, when obtaining four areas in the method of dividing shown in FIG. 3, the liquid crystal display circuit patterns 51A through 51D are arranged with respect to the glass substrate 15 as shown in FIG. 5(A). Also obtaining four areas in the method of dividing shown in FIG. 4, the liquid crystal display circuit patterns 52A through 52D are arranged with respect to the glass substrate 15 as shown in FIG. 6(A). Note that in each case, during exposure, reticles 57A through 57D or reticles 58A through 58D based on one liquid crystal display as shown in FIG. 5(B) or FIG. 6(B), are used. That is, the same reticles shown in FIG. 3(B) and FIG. 4(B) are used for FIG. 5(B) and FIG. 6(B).

Even in this plural-area method, when photoprinting a circuit pattern onto a glass substrate 15, sequentially using reticles 57A through 57D or reticles 58A through 58D, the same divided circuit pattern is sequentially exposed; the entire circuit pattern is exposed in this way.

Obtaining plural areas using the above-mentioned reticles 57A through 57D as shown in FIG. 5(B) or reticles 58A through 58D as shown in FIG. 6(B) increases the number of exposures, decreasing throughput of the exposure apparatus. This may be because the reticles 57A through 57D or reticles 58A through 58D are the same reticles as used for photoprinting the liquid crystal display circuit pattern. In other words, there may be a reason in that reticles used are not specific to the plural-area method. Therefore, in this second embodiment, reticles are formed specific to the plural-area method. Using such reticles reduces the number of exposures, increasing throughput for the exposure apparatus. This is described more specifically referring to the configuration of the exposure apparatus and the construction of reticles.

Figure 7:
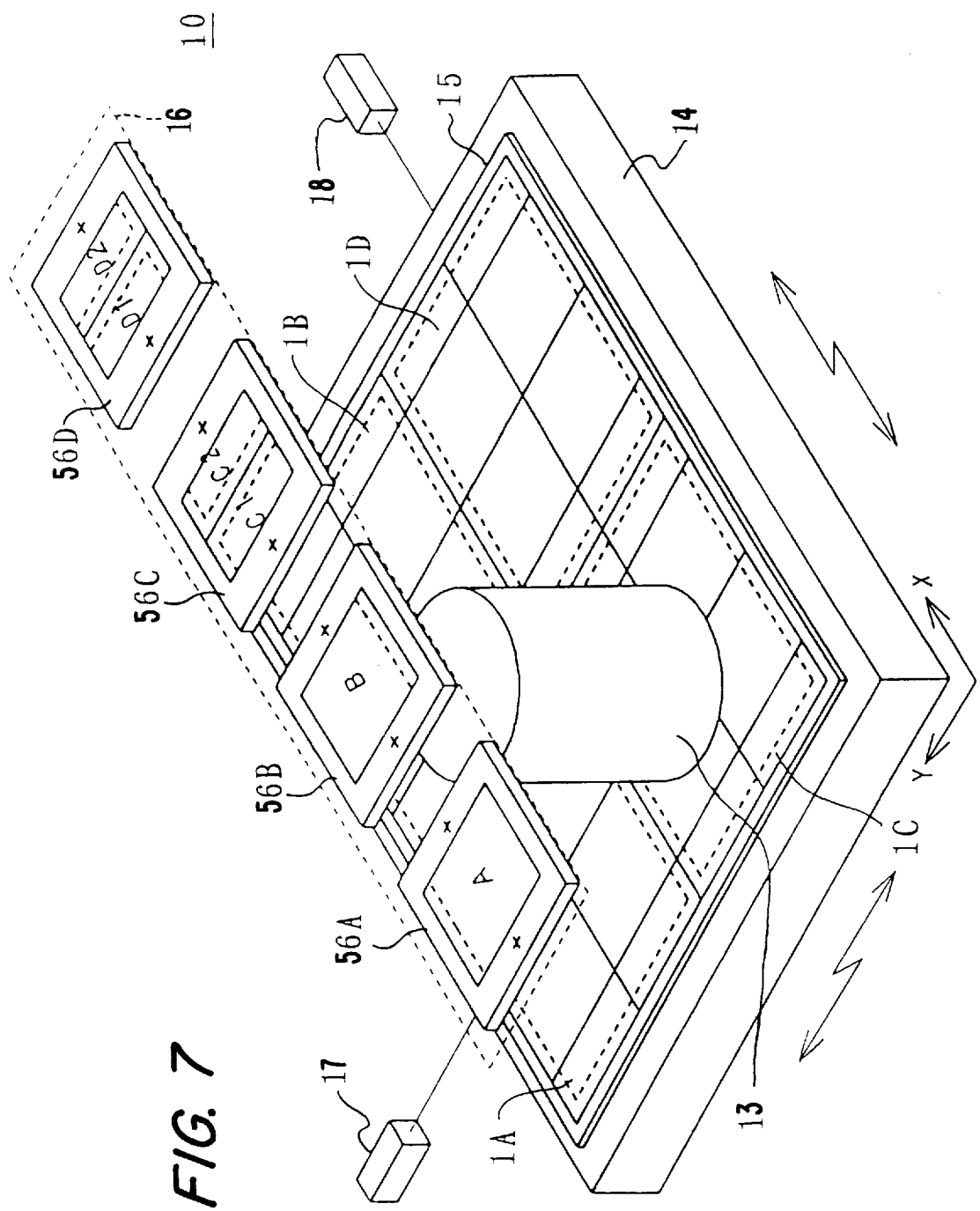
FIG. 7 is a perspective view of a second embodiment of the exposure apparatus incorporating the principles of the present invention.

In FIG. 7 showing the exposure apparatus 10 of the same configuration as the exposure apparatus of FIG. 1, a liquid crystal display circuit pattern is photoprinted onto a photosensitive substrate by consecutively exchanging a plurality of reticles printed with divided circuit patterns obtained by dividing the liquid crystal display circuit pattern through a plurality of exposures in the step-and-repeat method (four divisions shown with codes 1A through 1D in FIG. 7).

As described, the exposure apparatus 10 comprises roughly an XY stage 14 for loading a photosensitive glass substrate 15, a projection lens system 13 formed above the stage, and a reticle exchanger 16 formed above the projection lens system 13.

The reticle exchanger 16 formed above the projection lens system 13 holds, for example, a reticle 56A printed for example with a divided circuit pattern A, a reticle 56B printed with a divided circuit pattern B, a reticle 56C printed with the divided circuit patterns C1 and C2 and a reticle 56D printed with divided circuit patterns D1 and D2. Also, the exchanger 16 consecutively exchanges stored reticles 56A through 56D, thus arranging reticles to be exposed with divided patterns anywhere above the lens system 13.

The exposure apparatus 10 so configured, when photoprinting liquid crystal display circuit patterns (1A through 1D) onto the glass substrate 15 as mentioned above, first drives the reticle exchanger 16 to arrange, for example, a reticle 56A above the projection lens system 13. Then, by driving the XY stage 14, it moves the glass substrate 15 sequentially to position the shot position of the divided circuit pattern A under the projection lens system 13 sequentially. In this way, exposure light supplied via the reticle 56A is irradiated onto the glass substrate 15 sequentially to photoprint the divided circuit pattern A onto the glass substrate. Next, it drives the exchanger 16 to position the reticle 56B above the projection lens system 13, and drives the XY stage 14 to move the glass substrate 15 to position the shot position of the divided circuit pattern B under the projection lens system 13 sequentially, thus photoprinting the divided circuit pattern B onto the glass substrate 15 sequentially.

Then, the exposure apparatus 10 drives the exchanger 16 to position the reticle 56C above the projection lens system 13 and moves the glass substrate 15 by driving the XY stage 14 to position the shot position of the divided circuit patterns C1 and C2 under the projection lens system 13 sequentially, thus photoprinting the divided circuit patterns C1 and C2 onto the glass substrate 15 sequentially.

Finally, it positions the reticle 56D above the projection lens system 13, and moves the glass substrate 15 to position the shot position of the divided circuit patterns D1 and D2 under the projection lens system 13 sequentially, thus photoprinting the divided circuit patterns D1 and D2 onto the glass substrate 15 sequentially.

In this way, the exposure apparatus 10 photoprints the liquid crystal display circuit patterns (1A through 1D) onto the glass substrate 15.

Now, reticles 56A through 56D used in the exposure apparatus 10 are described herein.

Figure 8A:
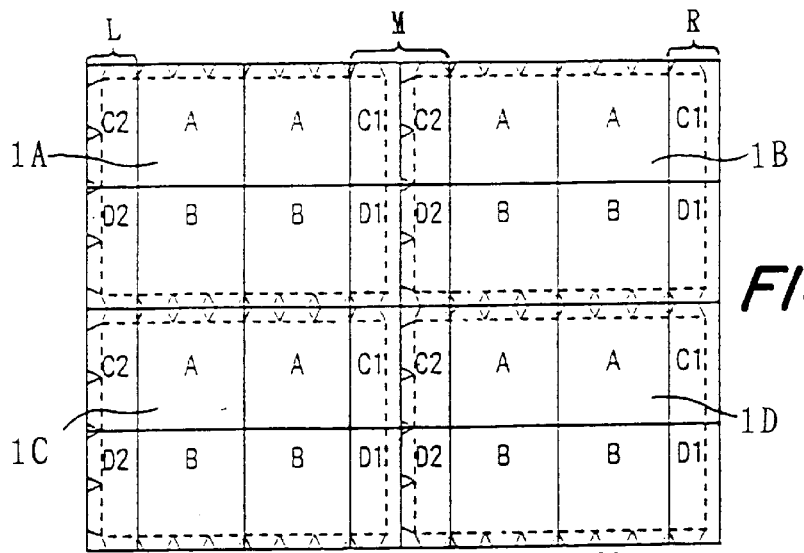
FIGS. 8(A) and 8(B), are a schematic diagram showing a method of dividing a circuit pattern and photoprinting reticles in accordance with the method of the present invention.

The four-area method is used in this embodiment as shown in FIG. 8(A) by photoprinting four liquid crystal display circuit patterns onto the glass substrate 15 (codes 1A through 1D in the figure). As is apparent from the figure, each of the liquid crystal display circuit patterns is arranged in the same manner as that shown in FIG. 5 in which the four-area method is used. The way that each of the liquid crystal display circuit patterns (1A through 1D) are divided is the same as that shown in the four-area method of FIG. 5.

Figure 8B:
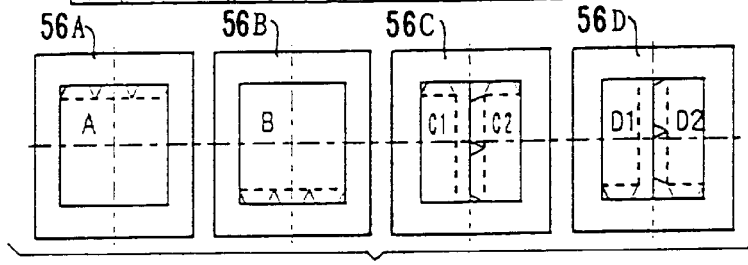

In this embodiment, however, as shown in FIG. 8(B), a different method is used for positioning the divided circuit patterns when photo-printing divided circuit patterns A through D2 onto reticles 56A through 56D. In this method, divided circuit patterns A and B are independently arranged on reticles in the same manner as described in FIG. 5. That is, reticle 56A of FIG. 8(B) and reticle 57A of FIG. 5(B) are the same while the reticles 56B and 57B are also the same. However, divided circuit patterns C1 and C2, and divided circuit patterns D1 and D2 are arranged on the glass substrate 15 in accordance with the interrelationship among them. Therefore, reticles 56C and 57C are different while reticles 56D and 57D are also different.

More specifically, as shown in FIG. 8(A), the divided circuit pattern C1 is positioned on the left side while the divided circuit pattern C2 is positioned on the right side in the region marked as M on the glass substrate 15, and at the same time, each of the divided circuit patterns are adjacent each other. In accordance with the interrelationship on the glass substrate 15, the divided circuit pattern C1 is arranged on the left side while the divided circuit pattern C2 is arranged on the right side on the reticle 56C of FIG. 8(B), and at the same time, each of the divided patterns are adjacent. In this way, when photoprinting divided circuit patterns C1 and C2 in the region M, the divided circuit patterns C1 and C2 can be exposed at the same time. This is not the case with reticle 57C of FIG. 5(B) where pattern C2 is on the left and pattern C1 is on the right.

In the same manner, the divided circuit pattern D1 is positioned on the left side while the divided circuit pattern D2 is positioned on the right side in the region marked as M on the glass substrate 15 of FIG. 8(A), and at the same time, each of the divided circuit patterns are next to each other. In accordance with the positional interrelationship, the divided circuit pattern D1 of reticle 56D of FIG. 8(B) is arranged on the left side while the divided circuit pattern D2 is arranged on the right side, and at the same time, each of the divided patterns are next to each other. In this way, in the region M, the divided circuit patterns D1 and D2 can be exposed at the same time. Note the difference in reticle 57D of FIG. 5(B).

In the configuration described above, this embodiment pays attention to the positional interrelationship between divided circuit patterns when performing the plural-area method on the glass substrate 15 and each of the divided circuit patterns next to each other on the glass substrate 15 are photoprinted individually onto a reticle. For example, the divided circuit pattern C1 of the circuit pattern 1A and a circuit pattern 1B which comes next to the divided circuit pattern C1 on the glass substrate 15 are arranged together on the reticle. In other words, the entire circuit pattern (1A through 1D) photoprinted onto the glass substrate 15 is considered as a single circuit pattern; the pattern obtained by dividing the entire circuit pattern (that is, divided circuit patterns A B, a divided circuit pattern C comprising divided circuit patterns C1 and C2, and a divided circuit pattern D comprising divided circuit patterns D1 and D2) are arranged on each of the reticles.

When photoprinting using reticles 56A through 56D formed in this method in the adjacent region marked M in which the plural-area method is performed, each of the divided circuit pattern C1 and C2 and divided circuit patterns D1 and D2 can be exposed at the same time. With this method, the exposure system 10 decreases the number of exposures and improves throughput.

Comparing the number of exposures, using reticles 57A through 57D shown in FIG. 5(B) requires a total of 32 exposes; using reticles 56A through 56D as shown in FIG. 8(B) allows each of the divided circuit patterns C1 and C2, and divided circuit patterns D1 and D2 being exposed at the same time, with 28 exposures. Therefore using reticles 56A through 56D decreases the number of exposures when both edges marked with codes L and R [see FIG. 8(A)] can be photoprinted with the images yet increasing throughput.

Note that when exposing both edges indicated with codes L and R as shown in FIG. 8(A) using reticles 56A through 56D, they can be exposed normally without covering the divided circuit patterns not to be exposed. For example, when photoprinting a divided circuit pattern C2 in the region L, if the divided circuit pattern C1 is exposed without being covered by a shutter, one may think that the divided circuit pattern C1 is photoprinted on the left side of the divided circuit pattern C2 on the glass substrate 15, however in reality, the circumference of the glass substrate 15 is already photosensitized by the peripheral exposure in advance, and it will not be exposed even if exposure light for the divided circuit pattern C1 is irradiated. In this way, by using reticles 56C and 56D for exposing, an effective and simple exposure can be provided.

Arranging each of the divided circuit patterns C1 and C2, and D1 and D2 which are next to each other on the glass substrate 15 as one set of divided circuit patterns onto the reticles 56C and 56D and by simultaneously exposing these divided circuit patterns C1 and C2, and D1 and D2 which are next to each other, this embodiment decreases the number of exposures while improving throughput of the exposure apparatus 10.

The plural-area method in which the liquid crystal display circuit patterns 56A through 56D are closely arranged on the glass substrate 15 is described in the above embodiment. However, the application incorporating the principles of the present invention is not limited solely to this. As shown in FIG. 9, spaces for dicing the substrate, shown by straight lines 67A and 67B may be provided between each of the circuit patterns 1A through 1D. In this case, in accordance with the positional interrelationship on the glass substrate 15, the divided circuit patterns can be arranged with a space for the straight line width on the reticle as well.

Figure 9A:
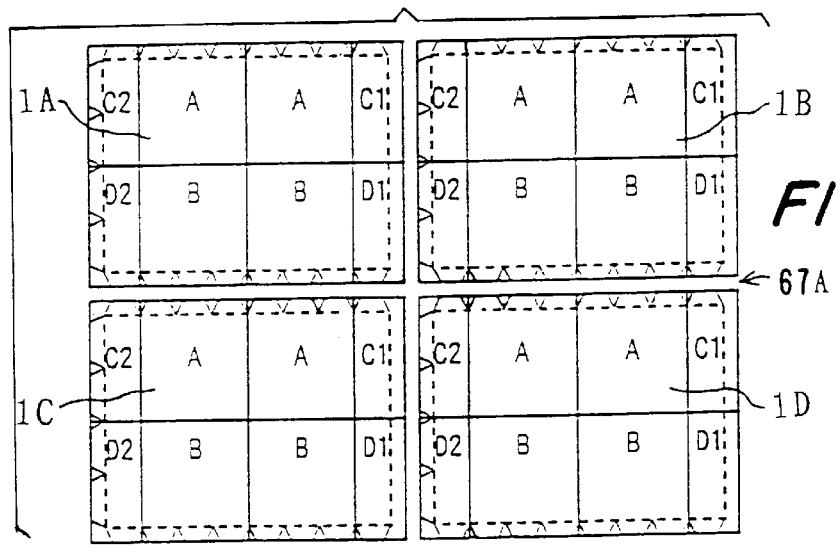
FIGS. 9(A) and 9(B), are a schematic diagram showing a circuit pattern having straight lines between each of the circuit patterns.
Figure 9B:
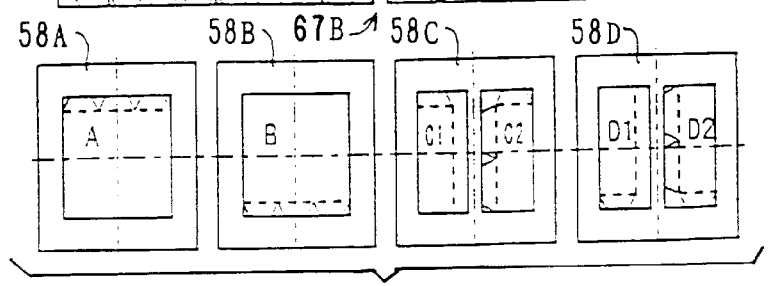

That is, as shown in FIG. 9(B), divided circuit patterns C1 and C2 which are next to each other are printed on the reticle 58C with a space therebetween for the straight line width. In the same manner, when printing divided circuit patterns D1, D2 which are next to each other on the reticle 58D, they are arranged with a space for the straight line width. By forming a shutter plate made from chrome (Cr), for example, in the space for preventing exposure light from transmission, as shown in FIG. 9(A), a straight line 67B can be formed between each of the divided circuit patterns C1 and C2, and D1 and D2 when being exposed. Note that to form the straight line 67A, divided circuit patterns A and B need to be exposed with a space for the straight line width.

Figure 10A:
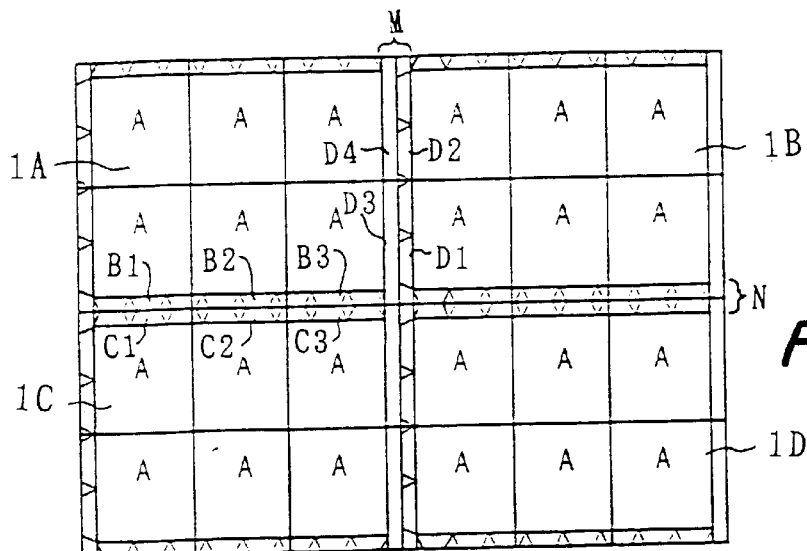
FIGS. 10(A) and 10(B), are a schematic diagram of another embodiment showing a method of dividing a circuit pattern and photoprinting reticles in accordance with the method of the present invention.
Figure 10B:
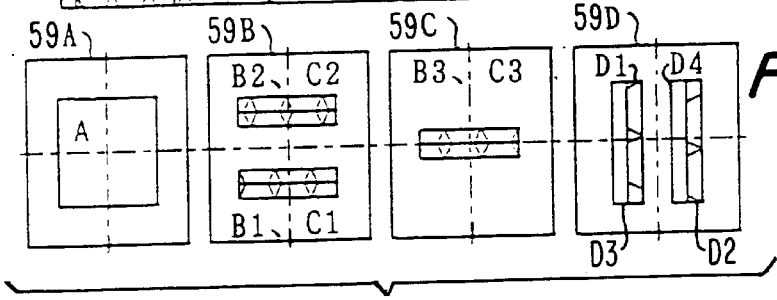

The above embodiment describes the method when the present invention is applied to the method of dividing shown in FIG. 5. However, the present invention is not limited to this and it can be applied to the method of dividing shown in FIG. 6. In that case also, as shown in FIG. 10, the divided circuit patterns which are next to each other should be arranged next to each other on a reticle as well. That is, the divided circuit pattern B1 of the circuit pattern 1A and the divided circuit pattern C1 of a circuit pattern 1C which are next to the divided circuit pattern B1 are arranged next to each other on the reticle 59B as well. In the same manner, the divided circuit patterns B3 and C3 are arranged next to each other on the reticle 59C; each of the adjacent divided circuit patterns D3 and D1, and D4 and D2 are arranged next to each other on the reticle 59D.

If the divided circuit patterns next to each other in the adjacent regions of circuit patterns marked with codes M or N are exposed simultaneously using the reticles 59A through 59D formed in the above-mentioned manner, even this method of dividing can decrease the number of exposures and improve the throughput of the exposure apparatus.

Figure 11A:
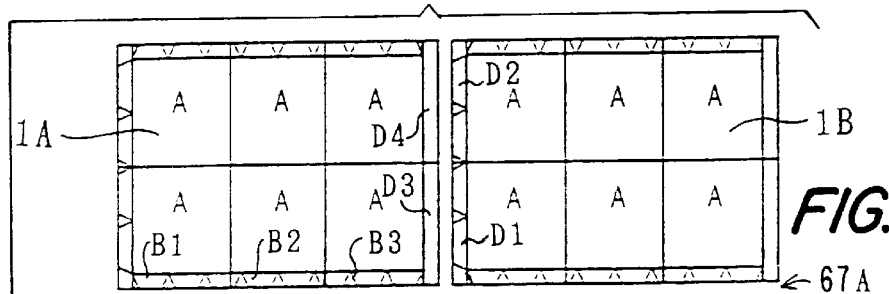
Figures 11(A) and 11(B), are a schematic diagram showing a circuit pattern having straight lines between each of the circuit patterns.
Figure 11B:
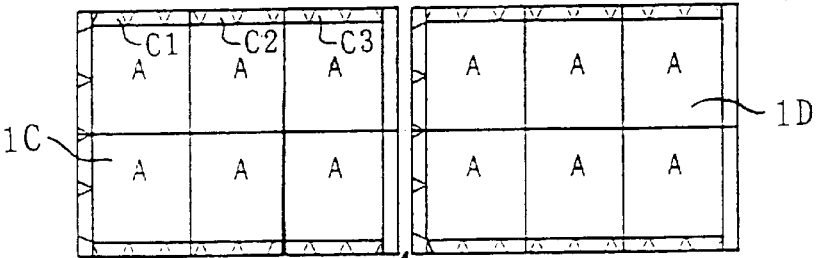

As shown in FIG. 11(A), the same as in the above-mentioned alternate embodiment, the straight lines 67A and 67B may be formed between each of the circuit patterns 1A through 1D. In this case, divided circuit patterns should be arranged with a space for the straight line width on the reticle in accordance with the positional interrelationship on the glass substrate 15 in this method of dividing. That is, as shown in FIG. 11(B), when photoprinting each of the divided circuit patterns B3 and C3, the divided circuit patterns D3 and D1, the divided circuit patterns D4 and D2 on the reticles 60B through 60D, they should be arranged with a space for the straight line. Forming a shutter plate such as chrome (Cr), for example, in the space will prevent the reticles from exposure light transmission, as shown in FIG. 11(A) will allow straight lines 67A and 67B to be formed between each of the divided circuit patterns B1 and C1, and B2 and C2, B3 and C3, D3 and D1, and D4 and D2 when being exposed. Note that to form the straight line 67A, divided circuit patterns A and B need to be exposed with a space for the straight line width.

In addition, the above embodiment describes the four-area method in which four liquid crystal display circuit patterns are exposed on the glass substrate 15. However, the method incorporating the principles of the present invention is not limited to this. Other plural-area methods such as the six-area method or the eight-area method may be used to obtain the same effects. The present invention can reduce the number of exposures by half in principle in the adjacent regions for each of the circuit patterns obtained in the plural-area method: the more areas are obtained, the more the number of exposures can be reduced to improve throughput for the exposure apparatus.

As described, according to the present invention, when photo-printing more than two circuit patterns using reticles printed with divided circuit patterns obtained by dividing a circuit pattern, a divided circuit pattern of one circuit pattern and a divided circuit pattern of another circuit pattern which are arranged next to each other on a photosensitive substrate are printed on one reticle; during photoprinting, exposing one divided circuit pattern printed on the reticle and the other divided circuit pattern at the same time can reduce the number of exposures, thus improving throughput for the exposure apparatus.

Various modifications will become possible for those skilled in the art after receiving the teachings of the present disclosure without departing from the scope thereof.

What is claimed is:

1. A method of dividing a circuit pattern to be transferred by a photoprinting apparatus from a reticle to a photosensitive surface, said circuit pattern having a display section and a conductor section, said method comprising the steps of:

dividing said circuit pattern into a plurality of divided patterns wherein each of said divided patterns includes at least a part of said display section and a part of said conductor section; and forming a plurality of said reticles, each of said reticles having at least one of said divided patterns thereon, and wherein said photoprinting apparatus has a projection lens system with a preselected field to photoprint said circuit patterns onto said photosensitive surface and said circuit pattern is divided based on at least one of three factors, the size of said circuit pattern, the number of said conductor sections, and the preselected field of said projection lens system.

2. A method of dividing a circuit pattern to be transferred by a photoprinting apparatus from a reticle to a photosensitive surface said method comprising the steps of:

forming a reticle having a plurality of divided patterns thereon, said divided patterns being arranged adjacent each other in the same manner as in said circuit pattern; and photolithographically transferring the images of said divided patterns on said reticle to said photosensitive surface with a single exposure of said photoprinting apparatus.

3. A method, as claimed in claim 2, wherein a plurality of reticles are formed with said divided patterns thereon and wherein said images of said divided patterns are superimposingly photoprinted on said photosensitive surface to form said circuit pattern.

4. A method, as claimed in claim 2, wherein said circuit pattern is a liquid crystal display element pattern.

5. A method, as claimed in claim 3, wherein said circuit pattern is a liquid crystal display element pattern.

6. A method, as claimed in claim 2, wherein a predetermined space is formed between each of said divided patterns on said reticle.

7. A method of photoprinting, as claimed in claim 6, wherein said predetermined space on said reticle prevents light from said photoprinting apparatus from reaching said photosensitive surface.

8. A method, as claimed in claim 2, wherein said reticle has an effective field for photolithographic transfer and wherein said circuit pattern is larger than said effective field of said reticle.

9. A method of dividing a circuit pattern to be transferred by a projection system with a preselected field from a reticle to a substrate, said circuit pattern having a display section and a conductor section, said method comprising the steps of:

dividing said circuit pattern into a plurality of divided patterns based on at least one of three factors, the size of said circuit pattern, the number of said conductor sections, and the preselected field of said projection system, wherein at least one of said divided patterns includes at least a part of said display section and a part of said conductor section; and forming said reticle having said divided patterns thereon.

10. A method according to claim 9 wherein said projection system comprises a projection lens system.

11. An exposure method which exposes a pattern of a mask onto a substrate, said pattern having a display section and a conductor section, said method comprising the steps of:

dividing said pattern into a plurality of divided patterns based on the number of said conductor sections wherein at least one of said divided patterns includes at least a part of said display section and a part of said conductor section; and transferring said divided patterns onto said substrate.

12. An exposure method according to claim 11, wherein said pattern is a liquid crystal display element pattern.

13. An exposure method according to claim 11, wherein said substrate is a glass substrate.

14. An exposure method according to claim 11, wherein said mask has a plurality of divided patterns.

15. A substrate on which said pattern has been transferred by the exposure method according to claim 11.

* * * * *

UNITED STATES PATENT AND TRADEMARK OFFICE
CERTIFICATE OF CORRECTION

PATENT NO. : 5,859,690
DATED : January 12, 1999
INVENTOR(S) : TOGUCHI, MANABU

It is certified that error appears in the above-identified patent and that said Letters Patent is hereby corrected as shown below:

Title Page, item [30] Foreign Application Priority Data second entry, amend "May 4, 1996  [JP]  Japan.................8-110305" to read
— April 5, 1996  [JP]  Japan.................8-110305—

Signed and Sealed this

Twentieth Day of July, 1999

Attest:

Q. TODD DICKINSON

Attesting Officer

Acting Commissioner of Patents and Trademarks